(12) United States Patent
Colinge et al.

(10) Patent No.: US 10,191,694 B2
(45) Date of Patent: *Jan. 29, 2019

(54) 3D CROSS-BAR NONVOLATILE MEMORY

(71) Applicant: TAIWAN SEMICONDUCTOR MANUFACTURING CO., LTD., Hsinchu (TW)

(72) Inventors: Jean-Pierre Colinge, Hsinchu (TW); Carlos H. Diaz, Mountain View, CA (US); Ta-Pen Guo, Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,196

(22) Filed: Apr. 17, 2017

(65) Prior Publication Data
US 2018/0059992 A1 Mar. 1, 2018

Related U.S. Application Data

(63) Continuation of application No. 15/253,189, filed on Aug. 31, 2016, now Pat. No. 9,660,107.

(51) Int. Cl.
*H01L 29/06* (2006.01)
*G06F 3/06* (2006.01)
(Continued)

(52) U.S. Cl.
CPC ............ *G06F 3/0679* (2013.01); *B82Y 10/00* (2013.01); *G06F 3/0688* (2013.01); *G11C 13/025* (2013.01); *G11C 14/009* (2013.01); *G11C 14/0018* (2013.01); *G11C 15/046* (2013.01); *H01L 21/02491* (2013.01); *H01L 27/0688* (2013.01); *H01L 27/11514* (2013.01); *H01L 27/11578* (2013.01); *H01L 29/0669* (2013.01); *H01L 29/66439* (2013.01); *H01L 29/775* (2013.01); *H01L 29/78654* (2013.01); *H01L 29/78696* (2013.01); *H01L 29/792* (2013.01);
(Continued)

(58) Field of Classification Search
CPC ......... H01L 21/02109; H01L 21/02365; H01L 21/02436; H01L 21/02518
See application file for complete search history.

(56) References Cited

U.S. PATENT DOCUMENTS 8,593,854 B1 11/2013 Chih et al.
8,869,436 B2 10/2014 Tsai et al.
(Continued)

FOREIGN PATENT DOCUMENTS

| CN | 102779851 A | 11/2012 |
|---|---|---|
| KR | 2009-0120937 A | 11/2009 |
| KR | 10-1431774 A | 8/2014 |

*Primary Examiner* — Cheung Lee
(74) *Attorney, Agent, or Firm* — Sterne, Kessler, Goldstein & Fox P.L.L.C.

(57) ABSTRACT

Semiconductor structures and methods for crystalline junctionless transistors used in nonvolatile memory arrays are introduced. Various embodiments in accordance with this disclosure provide a method of fabricating a monolithic 3D cross-bar nonvolatile memory array with low thermal budget. The method incorporates crystalline junctionless transistors into nonvolatile memory structures by transferring a layer of doped crystalline semiconductor material from a seed wafer to form the source, drain, and connecting channel of the junctionless transistor.

20 Claims, 15 Drawing Sheets

(51) Int. Cl.

| | |
|---|---|
| *H01L 29/792* | (2006.01) |
| *H01L 29/775* | (2006.01) |
| *H01L 29/786* | (2006.01) |
| *H01L 29/66* | (2006.01) |
| *H01L 21/02* | (2006.01) |
| *H01L 27/06* | (2006.01) |
| *H01L 27/11578* | (2017.01) |
| *G11C 13/02* | (2006.01) |
| *G11C 14/00* | (2006.01) |
| *G11C 15/04* | (2006.01) |
| *H01L 27/11514* | (2017.01) |
| *B82Y 10/00* | (2011.01) |

(52) U.S. Cl.
 CPC .... *H01L 29/0673* (2013.01); *H01L 29/66833* (2013.01)

(56) References Cited

U.S. PATENT DOCUMENTS

| | | |
|---|---|---|
| 8,878,251 B2 | 11/2014 | Park et al. |
| 9,019,743 B2 | 4/2015 | Tsai et al. |
| 9,023,699 B2 | 5/2015 | Chang et al. |
| 9,053,781 B2 | 6/2015 | Tsai et al. |
| 9,076,522 B2 | 7/2015 | You et al. |
| 9,153,343 B2 | 10/2015 | Chu et al. |
| 9,196,360 B2 | 11/2015 | Chou et al. |
| 9,224,470 B1 | 12/2015 | Chiu et al. |
| 9,660,107 B1 * | 5/2017 | Colinge ................ H01L 29/792 |
| 2006/0273397 A1 * | 12/2006 | Adkisson ........ H01L 21/823807 257/355 |
| 2012/0305893 A1 | 12/2012 | Colinge |
| 2013/0234094 A1 | 9/2013 | Chang et al. |
| 2014/0166961 A1 | 6/2014 | Liao et al. |
| 2014/0203236 A1 | 7/2014 | Chen et al. |
| 2014/0264222 A1 | 9/2014 | Yang et al. |
| 2014/0264233 A1 | 9/2014 | Tu et al. |
| 2015/0048297 A1 | 2/2015 | Hsieh et al. |
| 2015/0085558 A1 | 3/2015 | Chang et al. |
| 2015/0109849 A1 | 4/2015 | Tsai et al. |
| 2015/0109850 A1 | 4/2015 | Chang et al. |
| 2015/0170741 A1 | 6/2015 | Chih et al. |
| 2015/0269997 A1 | 9/2015 | Lin et al. |
| 2015/0333163 A1 | 11/2015 | Qiliang et al. |
| 2015/0380063 A1 | 12/2015 | Chang et al. |

* cited by examiner

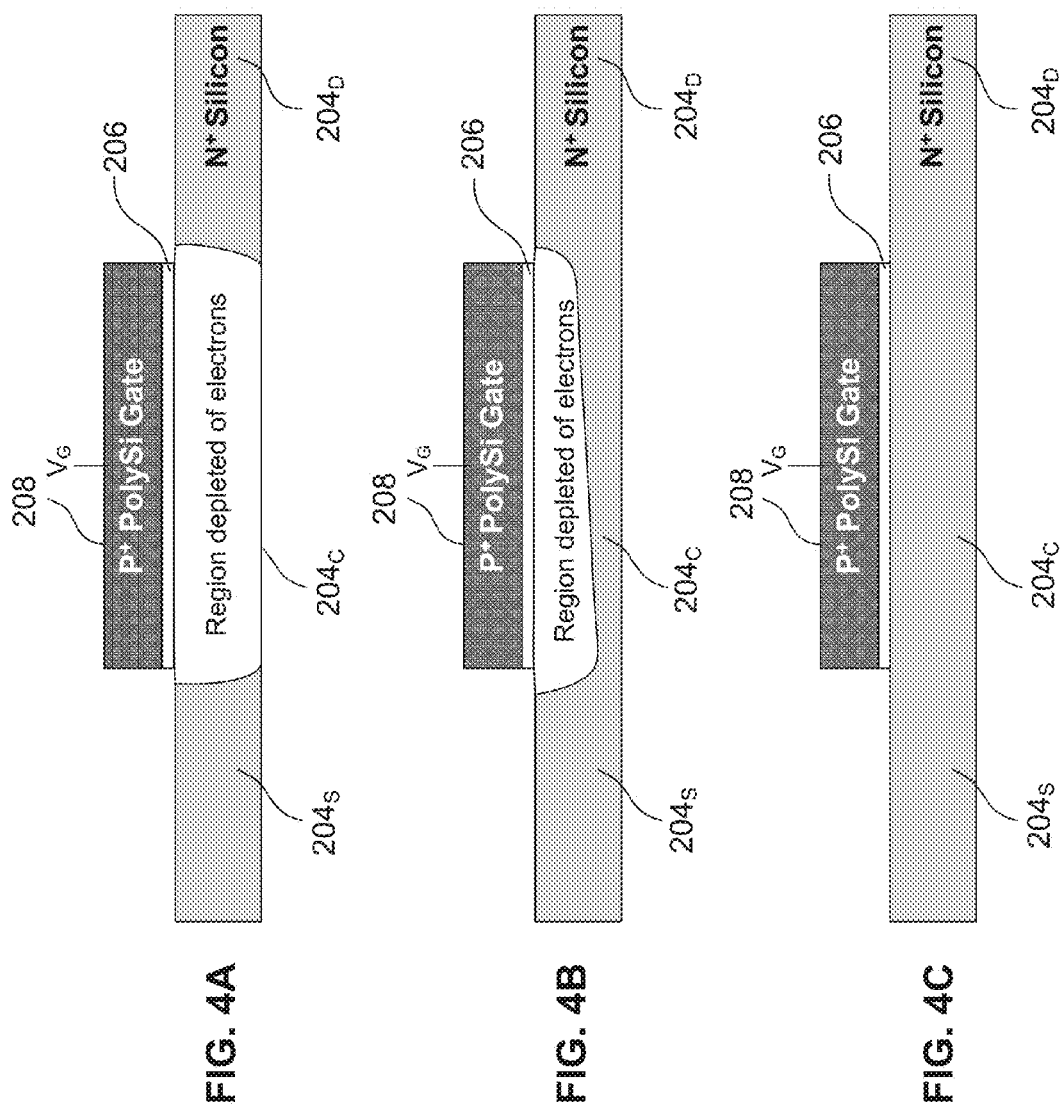

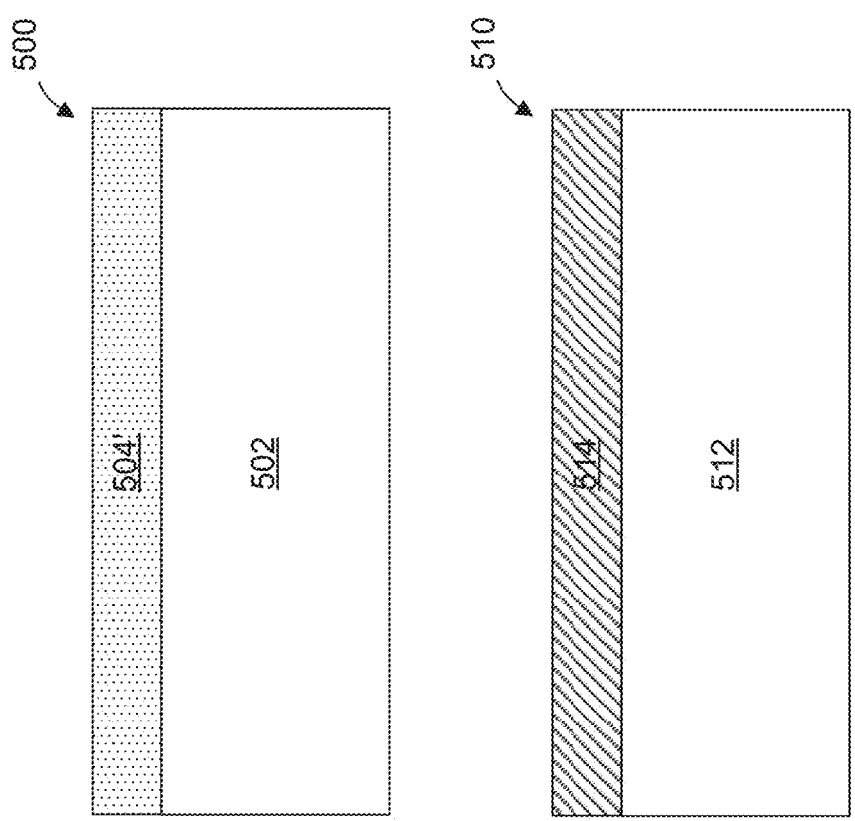

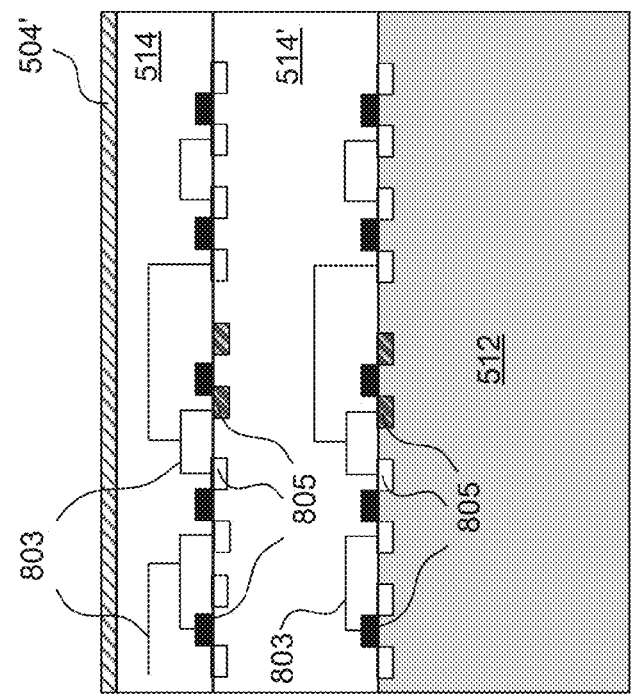
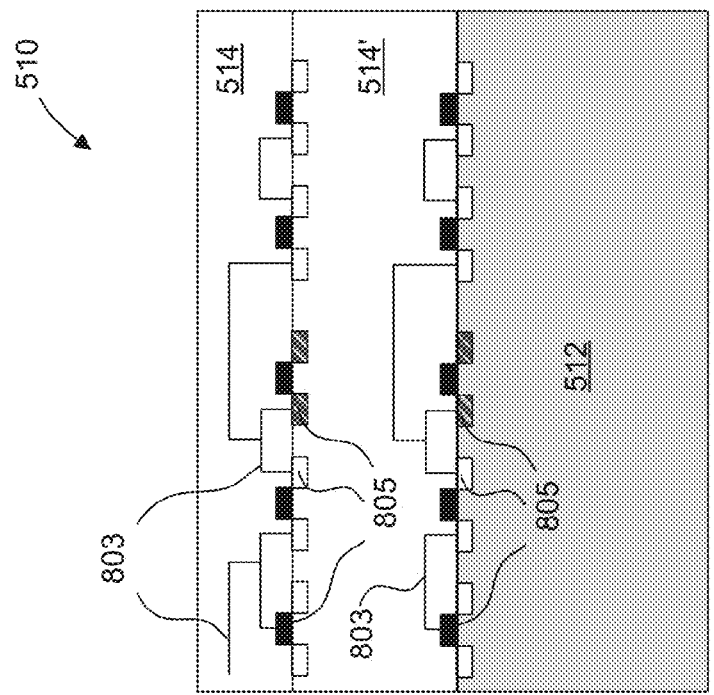
FIG. 8A
FIG. 8B

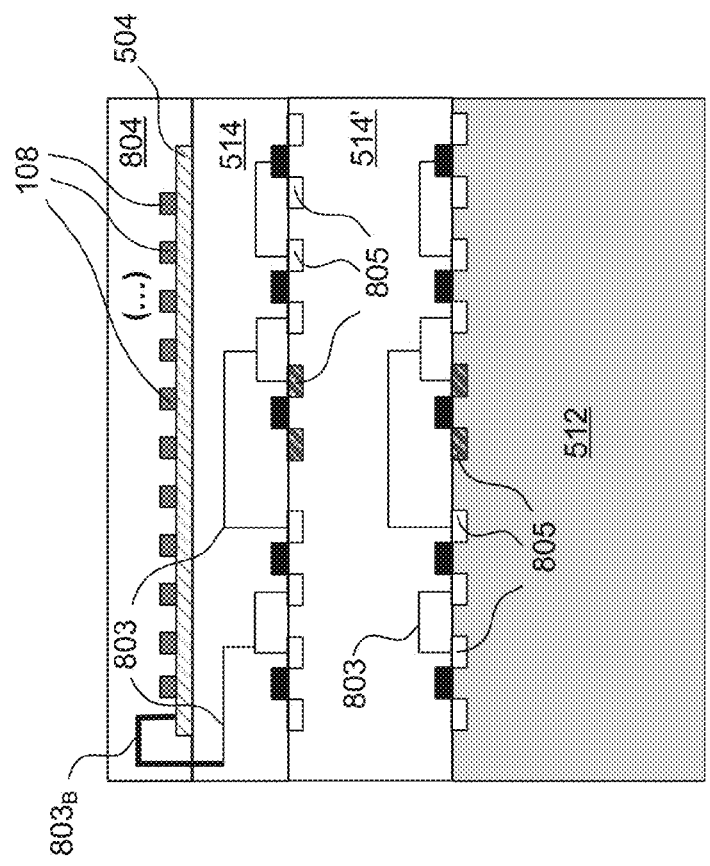
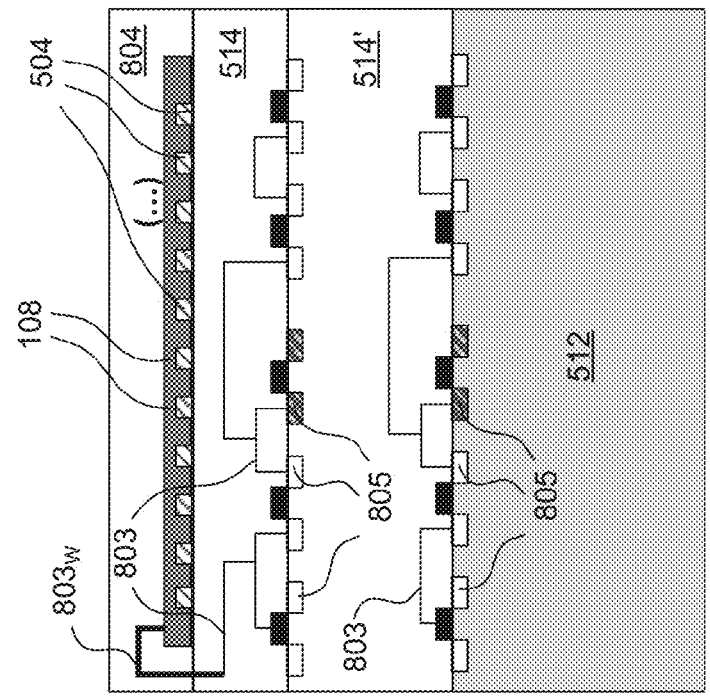
FIG. 8F
FIG. 8E

3D CROSS-BAR NONVOLATILE MEMORY

CROSS-REFERENCE TO RELATED APPLICATION

This application is a continuation of U.S. application Ser. No. 15/253,189, titled "3D Cross-Bar Nonvolatile Memory," filed on Aug. 31, 2016, which is incorporated by reference herein in its entirety.

BACKGROUND

Nonvolatile memory is often used in various devices, such as computers. Nonvolatile memory is a type of memory storage that can retain data even while it is not powered on. Nonvolatile memory may be electrically addressed. Examples of electrically addressed nonvolatile memory include flash memory, electrically programmable read-only memory (EPROM), and electrically erasable programmable read-only memory (EEPROM). Functionality of nonvolatile memory includes having information programmed into it, having information read from it, and/or having information erased from it.

Nonvolatile memory circuits often include electrical components such as, for example, diodes, capacitors, and resistors, each of which may be combined with transistors to form an electrical circuit.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 4A-4C illustrate exemplary operational states of an N-type junctionless transistor, in accordance with some embodiments.

FIGS. 5A-5C are cross-sectional views of various fabrication steps of forming a n-type junctionless transistor, in accordance with some embodiments.

FIGS. 8A-8F are cross-sectional views illustrating exemplary structures at intermediate stages of fabrication a 3D cross-bar nonvolatile memory array, in accordance with some embodiments.

DETAILED DESCRIPTION

Figure 1:
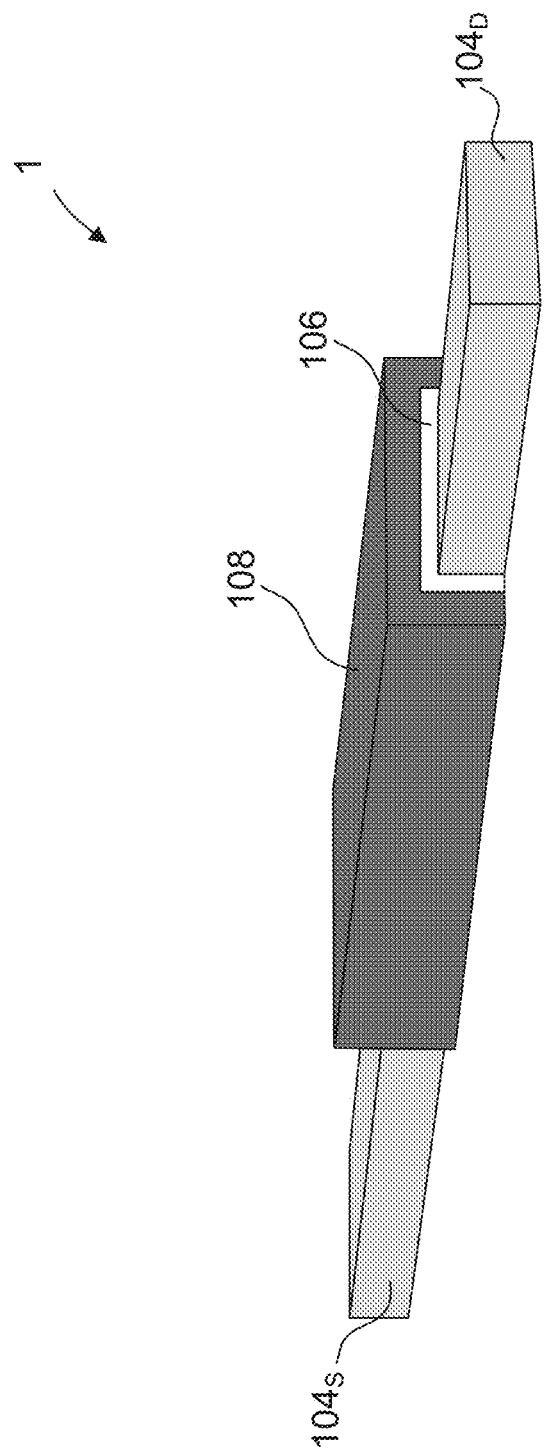
FIG. 1 is an isometric view of a junctionless transistor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The terms "S/D" and "source and drain" when used in the context of a MOSFET refer to the source and drain junctions that form two of the four terminals of a FET.

The terms "S/D" and "source and drain" when used in the context of a junctionless FET refer to the source and drain terminals that form two of the three terminals of a junctionless FET in accordance with some embodiments.

The term "junctionless transistor" refers to a transistor architecture having a first S/D terminal, a second S/D terminal, and a channel disposed between the first and second S/D terminals. The junctionless transistor's channel has a high doping concentration and is of the same conductivity type as the first and second S/D terminals. Junctionless transistor is referred to herein as a "JLFET." In some embodiments, ultra-high doping is a doping concentration greater than or equal to $5 \times 10^{18}$ atoms/cm$^3$. A JLFET is referred to an n-type JLFET when its first and second S/D terminals and channel are all n-type. Likewise, a JLFET is referred to as a p-type JLFET when its first and second S/D terminals, and channel are all p-type. JLFETs further include a gate electrode disposed over the channel and separated therefrom by a gate dielectric.

The expression "crystalline layer" herein refers to a layer or structure of single crystal material. Likewise, the expression "epitaxially-grown" herein refers to a layer or structure of single crystal material. Epitaxially-grown material may be doped or undoped.

The term "vertical," as used herein, means nominally perpendicular to the surface of a substrate.

Various embodiments in accordance with this disclosure provide methods of making an integrated circuit having a 3D cross-bar nonvolatile memory. Methods in accordance with some embodiments incorporate crystalline JLFETs into the 3D cross-bar nonvolatile memory within a relatively low thermal budget. Specifically, a layer of doped crystalline semiconductor material is transferred from a seed wafer to form the source, drain, and connecting channel of a JLFET. Other methods of making 3D nonvolatile memory use of a high-temperature annealing step to crystallize doped source and drain regions after the doping process. The conventional annealing process is either a solid-phase crystallization anneal for a few hours at 600° C., or a short anneal for a few nanoseconds at high temperature (e.g., 1,100° C.). These processes require a high thermal budget. One benefit of using transferred doped crystalline layers to form JLFETs is that an annealing process can either be performed on the JLFET structure prior to transferring on to the substrate, or be eliminated by directly incorporating doped crystalline semiconductor layers into the JLFET structure.

Before describing the embodiments related to the design and fabrication of 3D monolithic cross-bar nonvolatile memory structures, an embodiment operation process for a JLFET is presented.

FIG. 1 illustrates an isometric view of a JLFET 1 according to the disclosure. A semiconductor nanowire structure, for example a nanowire, fin, or nanoribbon, forms a source $104_S$, a drain $104_D$, and a channel (covered by gate dielectric and not visible in FIG. 1) partially surrounded by a gate electrode 108. Source $104_S$ and drain $104_D$ are portions of the semiconductor nanowire that are not surrounded by gate electrode 108. A gate dielectric 106 is disposed between gate electrode 108 and the channel. Therefore the channel is covered by gate electrode 108 and gate dielectric 106, and is not visible in FIG. 1.

In a conventional MOSFET the S/D junctions are self-aligned to the gate structure. In a similar way, the S/D terminals of a JLFET are self-aligned to the gate structure of the JLFET.

Figure 2:
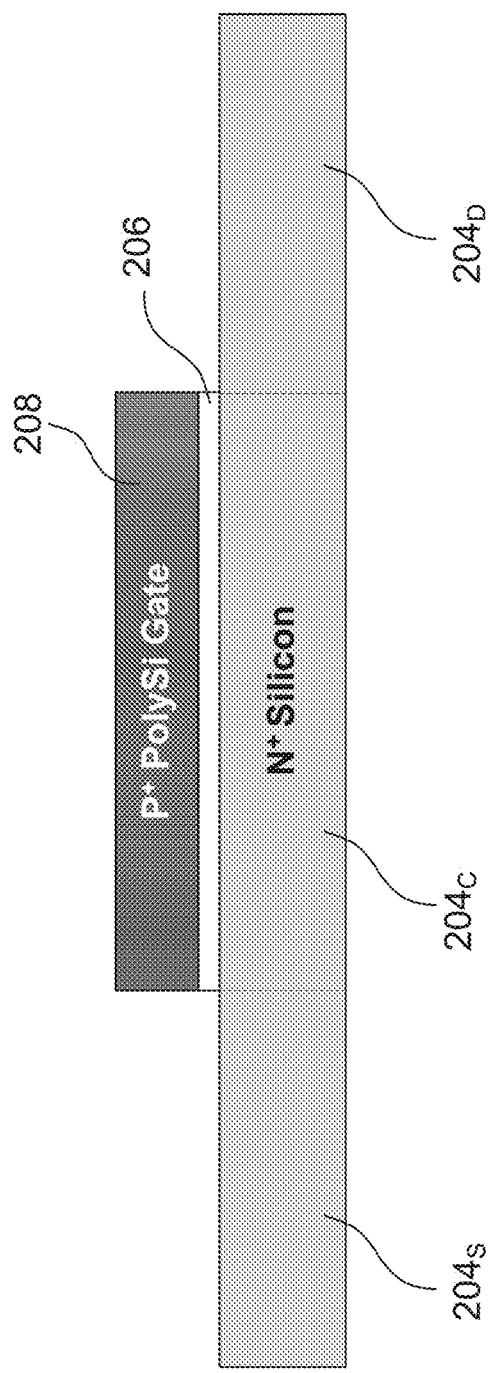
FIG. 2 is a cross-sectional view of a n-type silicon junctionless transistor, in accordance with this disclosure.

FIG. 2 shows an embodiment of n-type JLFET. A first source/drain terminal $204_S$, a channel $204_C$ and a second source/drain terminal $204_D$ are patterned from an n-type crystalline silicon semiconductor material. Gate electrode 208 is p-doped polysilicon. A gate dielectric 206 is disposed between gate electrode 208 and channel $204_C$.

Figure 3:
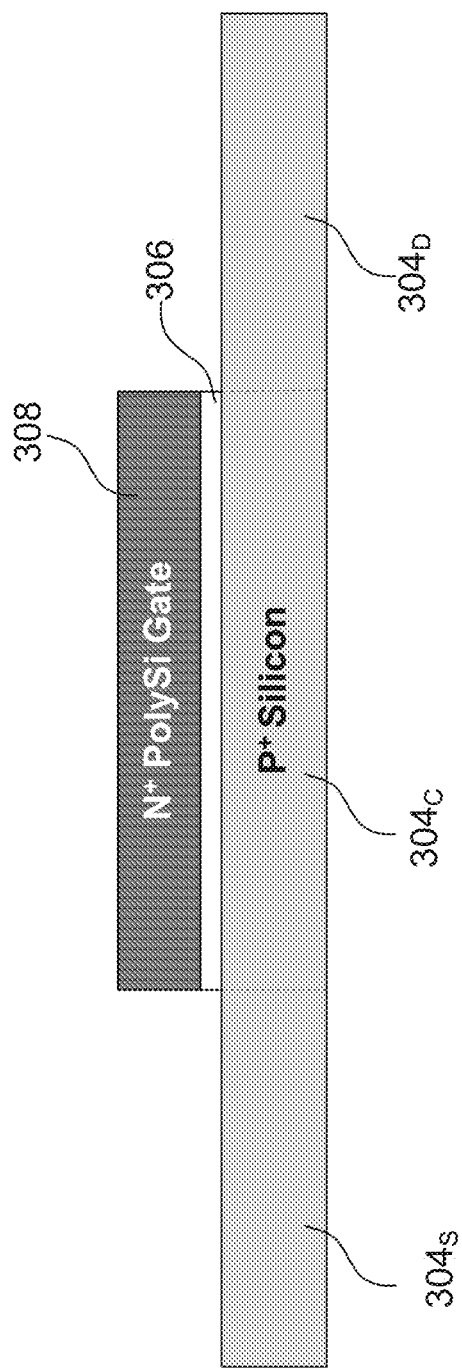
FIG. 3 is a cross-sectional view of a p-type silicon junctionless transistor, in accordance with some embodiments.

FIG. 3 shows an embodiment of p-type JLFET. A first source/drain terminal $304_S$, a channel $304_C$ and a second source/drain terminal $304_D$ are patterned from a p-type crystalline silicon semiconductor material. Gate electrode 308 is n-type polysilicon. A gate dielectric 306 is disposed between gate electrode 308 and channel $304_C$.

FIGS. 4A-4C are a number of views illustrating a sample operation of an n-type JLFET in accordance with some embodiments. The operation of the device (example of an n-type device) with various gate voltages $V_G(A)<V_G(B)<V_G(C)$ is as follows:

As shown in FIG. 4A, for a low gate voltage, for example 0V, channel region $204_C$ under gate electrode 208 is depleted of carriers and no current can flow between source $204_S$ and drain $204_D$. The device is effectively in an OFF state.

As shown in FIG. 4B, for a higher gate voltage, for example 0.4V, channel region $204_C$ under gate electrode 208 is partially depleted of carriers and some current can flow between source $204_S$ and drain $204_D$.

As shown in FIG. 4C, for a still higher gate voltage, for example IV, the region under gate electrode 208 is no longer depleted of carriers and can flow between source $204_S$ and drain $204_D$. The device is an ON state.

It will be appreciated that current can be further increased if the gate voltage is increased beyond $V_G(C)$ through an increase of the electron concentration in the region underneath the gate.

FIGS. 5A-5F provide various views of a semiconductor device that includes JLFETs during various stages of fabrication. The fabrication process provided here is exemplary, and many other steps may be performed that are not shown in these figures.

As illustrated in FIG. 5A, the fabrication process starts with a seed wafer 500 and a device wafer 510. Wafer 500 includes a first substrate 502 and a crystalline semiconductor layer 504'. Wafer 500 may also include other suitable layers, such as other dielectric layers or implanted layers. The other suitable layers may be placed between first substrate 502 and crystalline semiconductor layer 504', or embedded within first substrate 502. First substrate 502 is used as a seed wafer for mechanically supporting crystalline semiconductor layer 504', and may comprise any suitable material, for example, silicon. In some embodiments, crystalline semiconductor layer 504' is a silicon-based material. For example, crystalline semiconductor layer 504' is comprised of crystalline silicon and may be of various different crystal orientations, e.g., having a (100), (110), or (111) crystal orientation. In an embodiment, crystalline semiconductor layer 504' is directly formed over first substrate 502 through an epitaxial growth process. For example, crystalline semiconductor layer 504' may be epitaxially grown silicon or silicon germanium. In another embodiment, the crystalline structure of crystalline semiconductor layer 504' is obtained through a solid-phase epitaxial (SPE) regrowth method. In another embodiment, the crystalline structure of crystalline semiconductor layer 504' is obtained through ion implantation and annealing, or any other doping technique. The top surface of crystalline semiconductor layer 504' may be covered by an oxide layer, such as silicon dioxide layer (not shown in the figures).

In an embodiment, crystalline semiconductor layer 504' is a doped semiconductor layer. Crystalline semiconductor layer 504' can be an n-type doped silicon layer that is doped with phosphorus (Si:P) or with both phosphorus and carbon (Si:CP). Carbon could impede the out-diffusion of phosphorus from silicon-based material. In some embodiments, crystalline semiconductor layer 504' can be an n-type doped silicon layer that is doped with arsenic. Other types of dopants may also be included. In some embodiments, the phosphorus dopant concentration is in a range from about $5\times10^{18}$ atoms/cm$^3$ to about $5\times10^{19}$ atoms/cm$^3$. In some embodiments, the carbon dopant concentration is in a range from about 0% to about 5% (atomic percent). Crystalline semiconductor layer 504' may also be a p-type heavily-doped silicon layer. For example, crystalline semiconductor layer 504' may be heavily doped with boron. Other types of dopants for forming p-type doped silicon layer may also be included, for example, gallium or indium. Ion implantation has been used as a doping process for many technology nodes. Embodiments in accordance with the present disclosure are not limited to ion implantation as the doping process for crystalline semiconductor layer 504'. An annealing process may be performed subsequent to the doping process.

Device wafer 510 includes a second substrate 512 and an isolation layer 514. Second substrate 512 may be a silicon substrate. Alternatively, second substrate 512 may comprise another elementary semiconductor material, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Second substrate 512 may also be an n-type or p-type doped silicon layer. The second substrate may be a processed integrated circuit wafer containing e.g., a plurality of transistors configured to be CMOS circuits. These circuits may include logic, analog, RF (radio-frequency) parts made out of a variety of transistors, capacitors, resistors and interconnections. Isolation layer 514 may be an inter-layer dielectric (ILD)/inter-metallization dielectric (IMD) layer. Isolation layer 514 comprises, for example, a dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that isolation layer 514 may comprise a plurality of dielectric layers that are embedded with metallic interconnects, such as copper interconnects and tungsten, cobalt or titanium nitride vias.

Device wafer 510 may also include a logic circuit, a CMOS circuit, an analog-to-digital converter, a data processing circuit, a memory circuit, a bias circuit, a reference circuit, and the like.

Figure 5C:
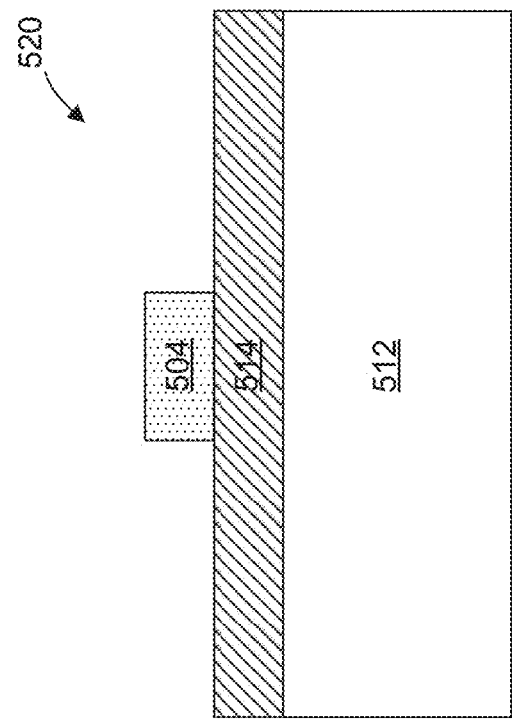
Figure 5B:
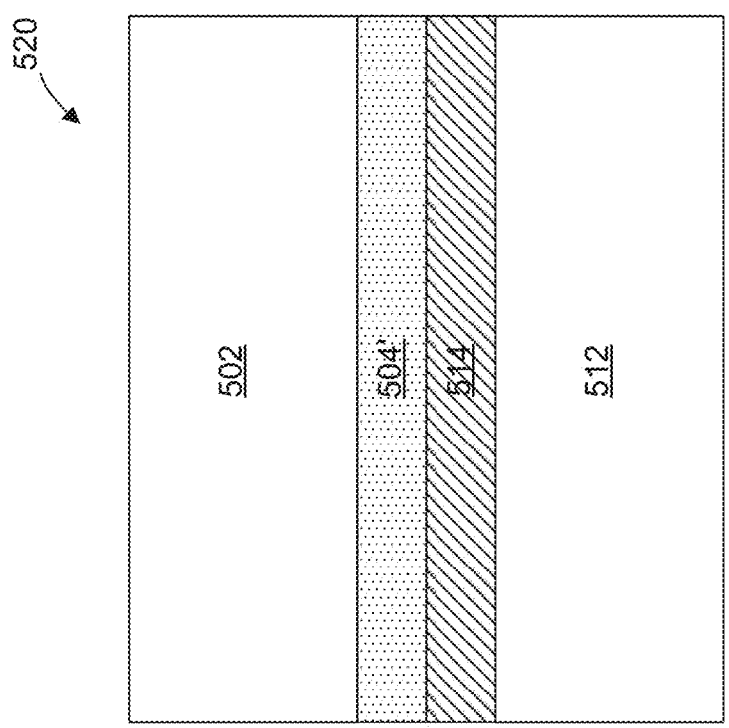

FIG. 5B illustrates a bonding process performed to bond seed wafer 500 and device wafer 510. With crystalline semiconductor layer 504' from seed wafer 500 and isolation layer 514 from device wafer 510 facing each other, seed wafer 500 and device wafer 510 are bonded using, for example, a direct bonding process such as dielectric-to-dielectric bonding (e.g., oxide-to-oxide bonding), metal-to-dielectric bonding (e.g., oxide-to-copper bonding), any combinations thereof and/or the like. The bonding occurs between the top surface of seed wafer 500, i.e., the surface of crystalline semiconductor layer 504', to the top surface of device wafer 510, i.e., the surface of isolation layer 514. Prior to bonding, the surfaces of the wafers to be bonded are cleaned to remove any residual liquids or particles from the wafer surfaces. The bonding process forms a wafer assembly 520.

The bonding may be at wafer level, wherein seed wafer 500 and device wafer 510 are bonded together, and are then separated. Alternatively, the bonding may be performed at the die-to-die level, or the die-to-wafer level.

Referring to FIG. 5C, a thinning process is performed to remove first substrate 502 from wafer assembly 520. The thinning process is implemented by using suitable techniques such as grinding and chemical-mechanical polishing (CMP). Besides thinning process, bonding and separation processes are also required. As a result of the thinning process, first substrate 502 is removed or detached and crystalline semiconductor layer 504' is exposed.

Crystalline semiconductor layer 504' is further processed to form nanowires, fins, or nanoribbons (hereinafter referred to as "nanowires"). 504. Nanowires 504 are used as the source/drain and channel regions of JLFETs. The nanowires are photolithographically patterned from crystalline semiconductor layer 504' using well-known process operations including, but not limited to, forming and patterning a resist layer, etching the exposed portions, and stripping the patterned resist. Although FIG. 5C shows nanowires 504 to have a rectangular cross-sectional area, nanowires 504 can be formed into any suitable shapes.

Figure 5D:
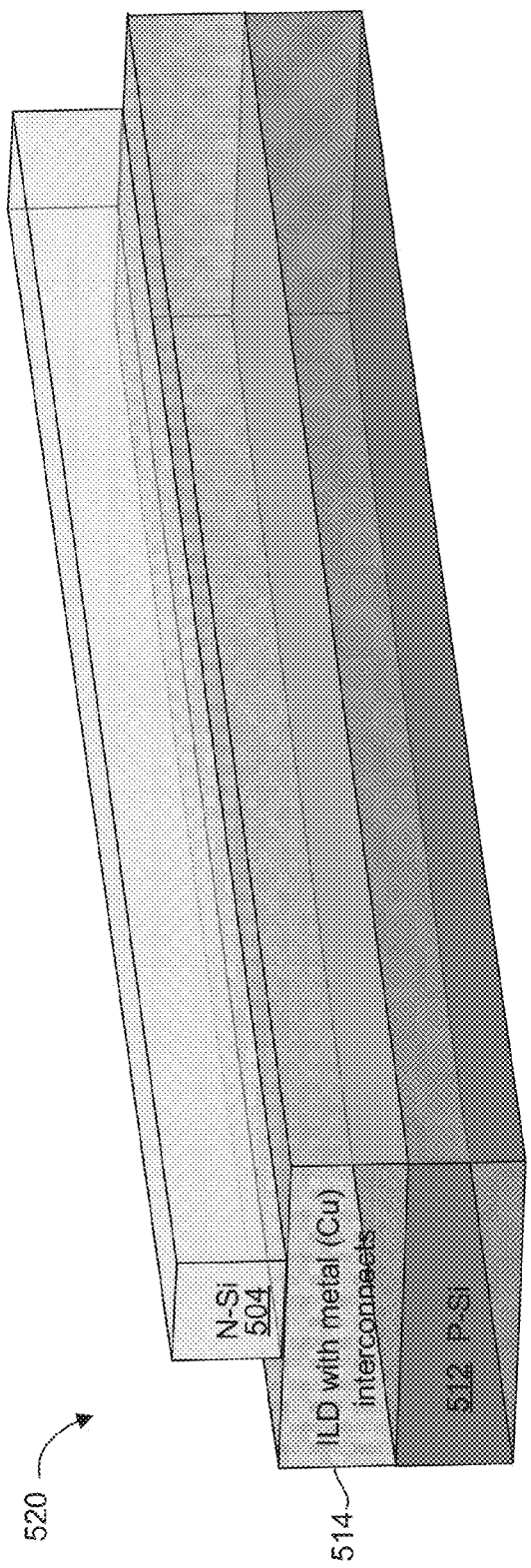
FIGS. 5D-5F are isometric views of various fabrication steps of forming a n-type junctionless transistor, in accordance with some embodiments.
Figure 5E:
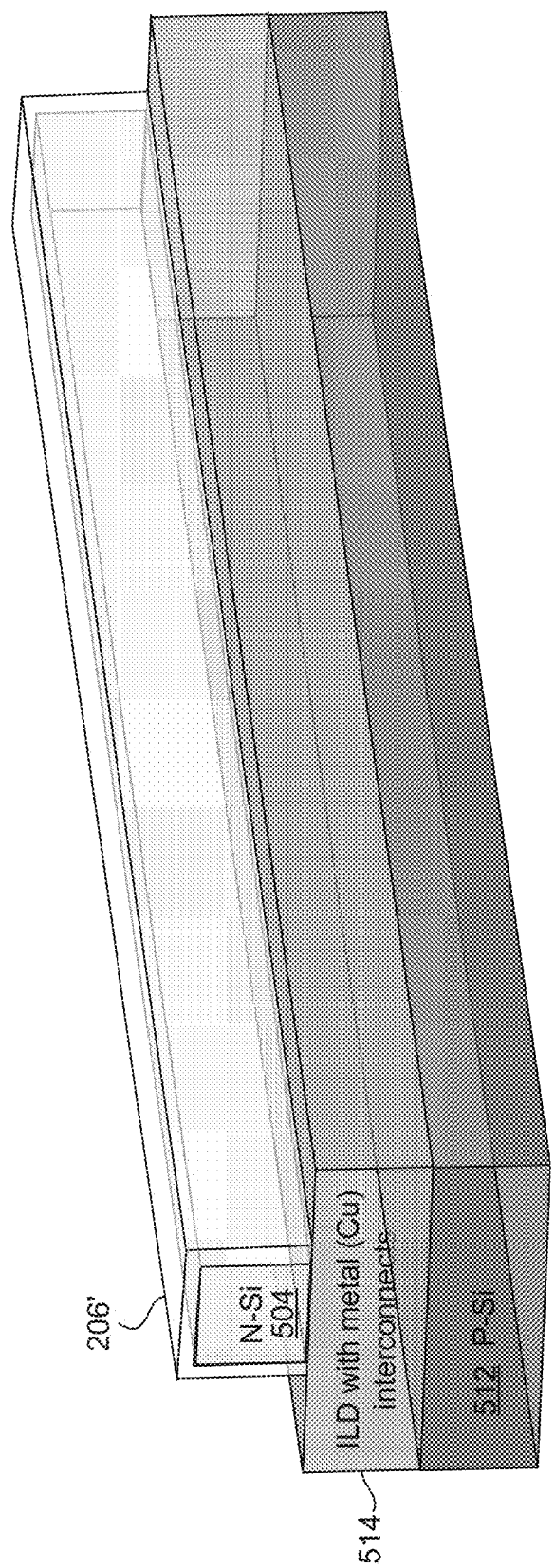
Figure 5F:
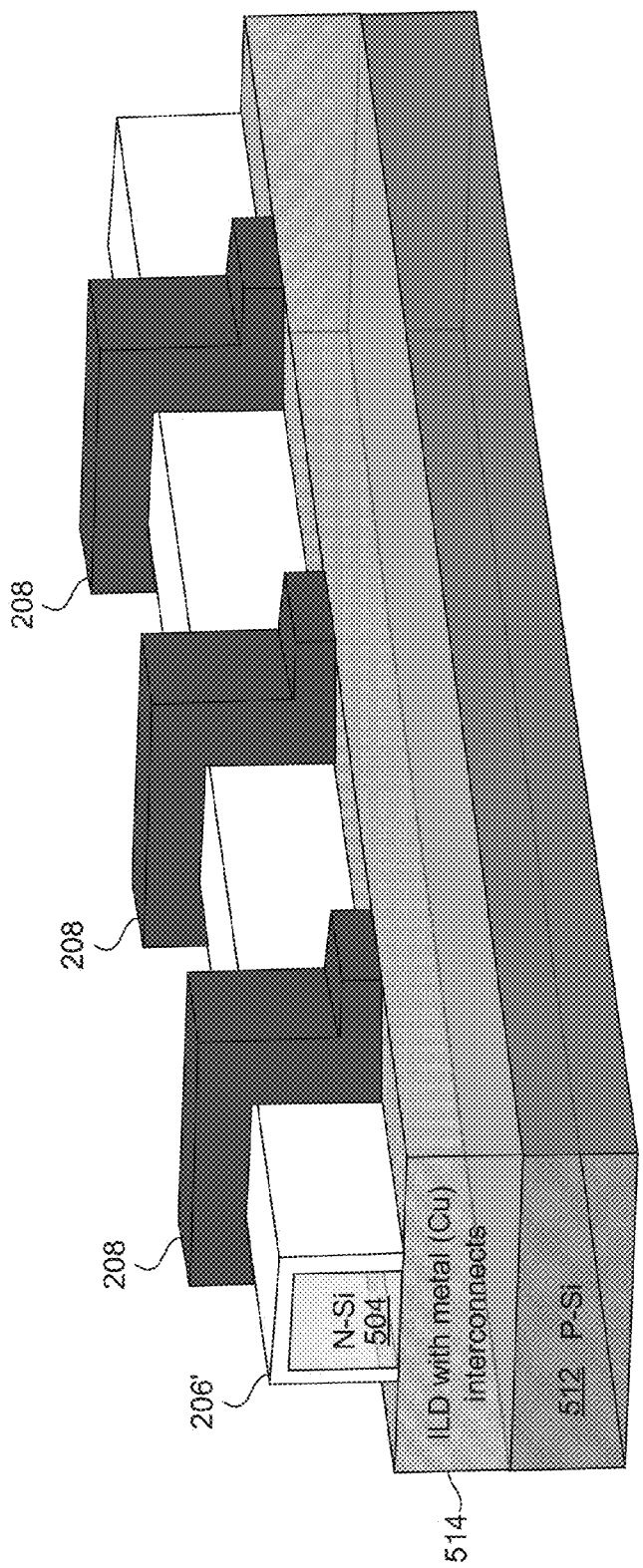

Referring to FIGS. 5D-5F, isometric views of various intermediate structures that result from an embodiment process of making an n-type JLFET are shown. An n-type JLFET can be fabricated using the previously described wafer assembly 520. In this exemplary embodiment, nanowires 504 are doped n-type crystalline silicon material, isolation layer 514 comprises an ILD layer embedded with copper interconnects, and second substrate 512 comprises doped p-type silicon material. Second substrate 512 and isolation layer 514 may include a logic circuit, a CMOS circuit, an analog-to-digital converter, a data processing circuit, a memory circuit, a memory control circuit, a bias circuit, a reference circuit, and the like. In some embodiments wafer assembly 520 includes an insulator layer positioned at the interface between nanowires 504 and isolation layer 514 (not shown in FIGS. 5D-5F).

In FIG. 5E, a gate dielectric layer 206' is formed around at least a portion of nanowire 504. In an embodiment, gate dielectric layer 206' is initially deposited on the exposed surfaces of nanowire 504 and isolation layer 514. For a charge-trapping nonvolatile memory array, gate dielectric layer 206' is a stack of materials such as, but not limited to, oxide-nitride-oxide (ONO). ONO stack is reliable over silicon surfaces, and is typically used as a capacitor insulator. ONO stack can be formed by thermally oxidizing a silicon surface to form an ultra-thin bottom oxide layer, depositing an LPCVD silicon nitride layer, and oxidizing the silicon nitride layer to form a top oxide layer. Other materials, such as NO, $Ta_2O_5$, $TiO_2$, lead zirconate titanate (PZT), or barium strontium (BST) can be used as the gate dielectric layer 206'.

As illustrated in FIG. 5F, one or more gate electrodes 208 are formed around a portion of gate dielectric layer 206' to form n-type JLFETs. The portions of gate dielectric layer 206' that are in contact with gate electrodes 208 form a plurality of gate dielectrics 206 which are not visible in FIG. 6 since they are covered by gate electrodes 208. Gate dielectric 206 and gate electrodes 208 together comprise gate regions that are configured to control conductivity of the channel regions connecting the source/drain regions. Gate electrode 208 may be formed from any suitable metal or electrically conductive material, for example, TiN, Pt, Ni, silicide, doped p-type silicon material, or other material/combinations thereof. Gate electrode 208 may be formed using a litho-etch gate-first process or a damascene process. In an embodiment, gate dielectric layer 206' can be further processed to remain only under gate electrodes 208, such that the source/drain areas would be exposed for further processing. The n-type JLFET thus includes source/drain regions, channel region, and gate region including gate dielectric 206 and gate electrode 208. FIG. 5F shows a plurality of JLFETs connected in series with each of the plurality of JLFETs having a pair of S/D terminals.

Figure 6:
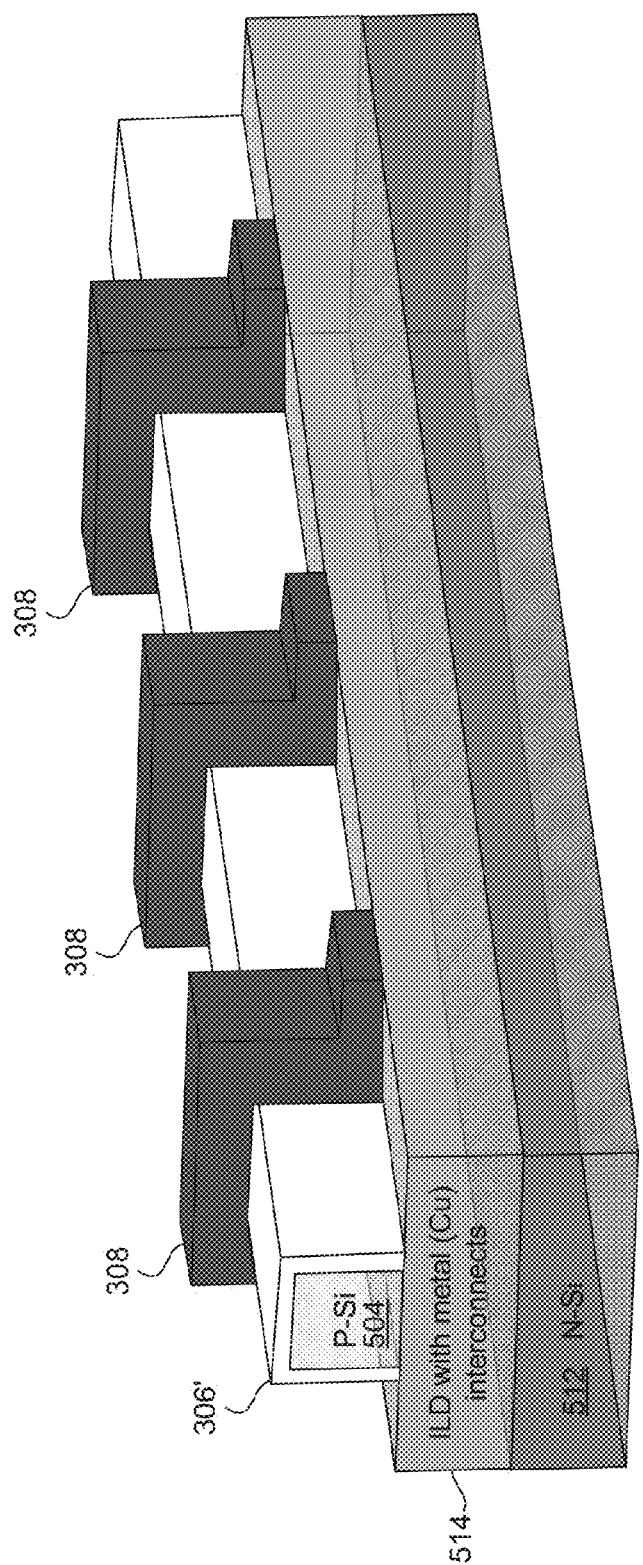
FIG. 6 is an isometric view of a p-type junctionless transistor structure, in accordance with some embodiments.

In FIG. 6, a p-type JLFET is formed using a similar process as described with respect to FIGS. 5A-5F. In this exemplary embodiment, nanowires 504 are heavily doped with p-type dopants, such as boron, gallium or indium. Second substrate 512 may also be a silicon layer that is doped with n-type, p-type, or H-type dopants. Second substrate 512 may also be an un-doped silicon layer. Further, second substrate 512 may be a processed integrated circuit wafer containing e.g., CMOS circuits. These circuits may include logic, analog, RF (radio-frequency) parts made out of a variety of transistors, capacitors, resistors and interconnections. The p-type JLFET may thus include source/drain regions, channel region, and gate regions having gate dielectric 306 and gate electrode 308. Since gate dielectric 306 is covered by gate electrode 308, only gate dielectric layer 306' is visible in FIG. 6.

The JLFETs described above with respect to FIGS. 1-6 may be used to form a variety of structures, such as but not limited to, 3D nonvolatile memory arrays, described below with respect to FIGS. 7-8F.

Figure 7:
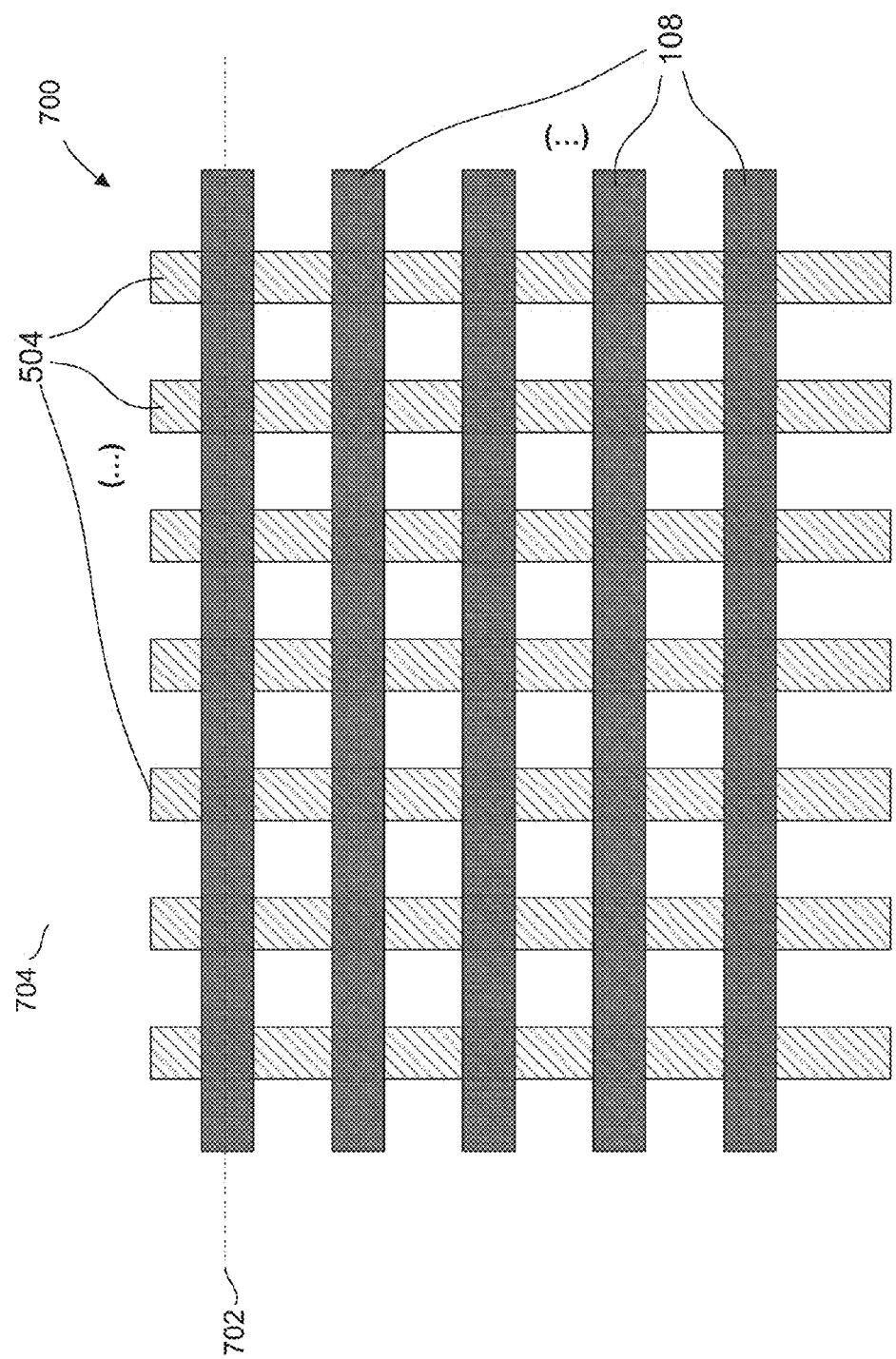
FIG. 7 is a top view of a nonvolatile memory array, in accordance with some embodiments.

FIG. 7 shows a top view of a nonvolatile charge-trapping memory array 700 that includes JLFETs. In this exemplary embodiment, nanowires 504 and electrodes 108 are used as bit lines and word lines, respectively, to form nonvolatile memory arrays having a cross-bar architecture. As a result, memory cells of nonvolatile memory 700 are located at the intersections of word lines and bit lines, allowing the cells to be addressed individually. Gate dielectrics 106 (not shown in FIG. 7) are also formed at each JLFET. Gate dielectrics 106 may be a suitable charge-trapping stack of materials, such as oxide-nitride-oxide (ONO). Nonvolatile memory array 700 may be formed on device wafer 510 (not shown in FIG. 7) as explained in detail below.

FIG. 8A depicts a cross-sectional view taken along cut 702 of FIG. 7, of an embodiment device wafer 510 prior to the transfer of crystalline semiconductor layer 504'. As explained above with reference to FIG. 5A, device wafer 510 may include one or more devices or features formed therein and/or thereon. An example of such one or more devices or features is illustrated in FIG. 8A, which includes metallic interconnects 803 and transistors 805 formed in second substrate 512 and isolation layer 514. There may be multiple isolation layers 514' embedded with interconnects 803 and transistors 805. The metallic interconnects 803, such as copper vias, provide electrical connections for various portions of device wafer 510. In an exemplary embodiment, isolation layer 514 may be an ILD layer embedded with copper vias.

FIG. 8B is a cross-sectional view taken along cut 702 of FIG. 7 showing device wafer 510 with a transferred crystalline semiconductor layer 504' formed on the top surface. As described above with reference to FIGS. 5A-5C, crystalline semiconductor layer 504' may be transferred from a seed wafer 500 through a suitable wafer bonding method. For example, a direct bonding process, a metal-to-dielectric bonding process, any combinations thereof and/or the like. Crystalline semiconductor layer 504' is doped with the desired dopant type and concentration for making n-type or p-type JLFETs prior to the transferring process.

Figure 8D:
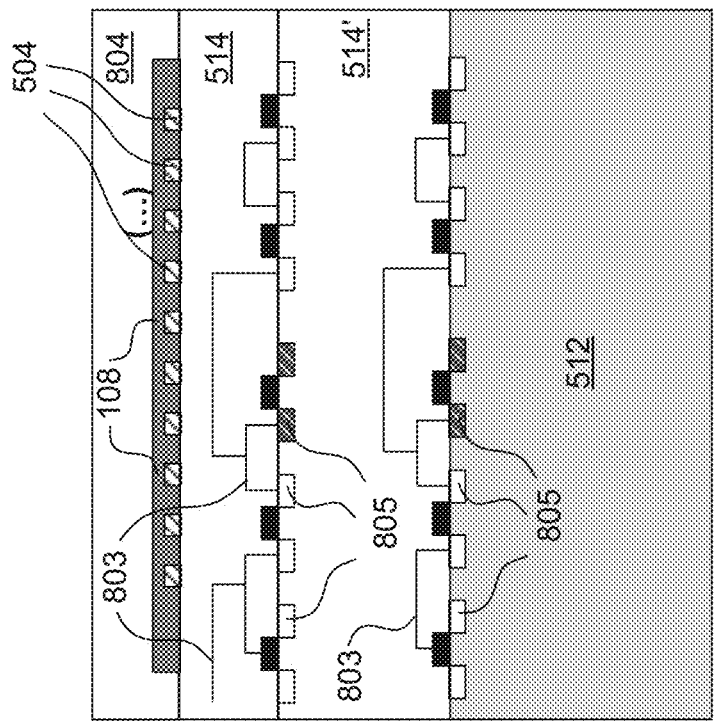
Figure 8C:
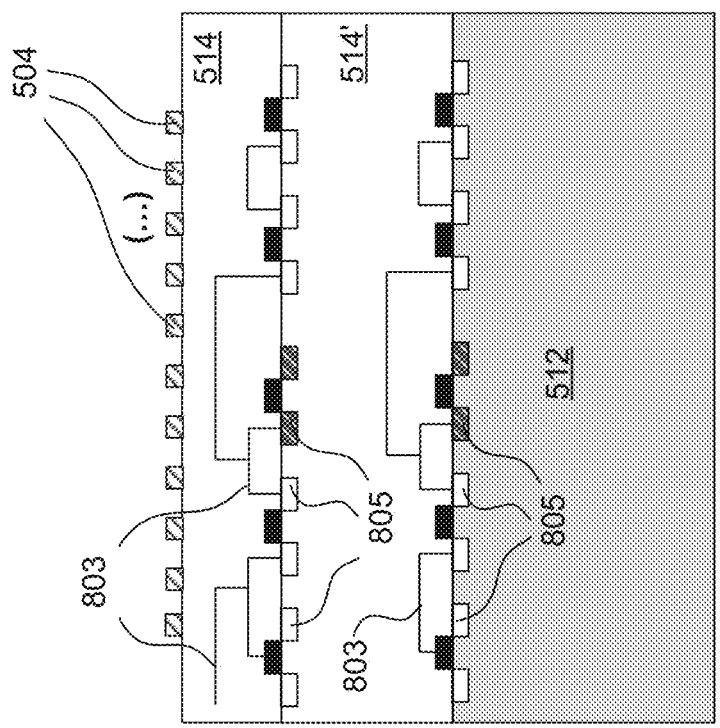

FIG. 8C, shows crystalline semiconductor layer 504' after it has been further processed to form nanowires 504. As shown in FIG. 8C, a plurality of nanowires 504 are formed on isolation layer 514. Nanowires 504 are used as the source, drain and channel regions of JLFETs. Nanowires 504 are patterned from crystalline semiconductor layer 504' using suitable processes including photolithography and etch processes. The plurality of nanowires 504 are used as bit lines of 3D nonvolatile memory array 700.

In FIG. 8D, similar to the processes described above with reference to FIG. 5F, gate regions, including gate dielectrics 106 (not shown) and gate electrodes 108, are formed over the plurality of nanowires 504. As shown in FIGS. 7 and 8D, each gate electrode 108 can be used to control a corresponding JLFET. In this exemplary embodiment, each JLFET functions as a nonvolatile memory cell. A second isolation layer 804 is shown formed over the plurality of JLFETs. In further embodiments, second isolation layer 804 provides a surface for stacking additional memory arrays. Similar to isolation layer 514, second isolation layer 804 may be an ILD layer formed of a low-k dielectric material by any suitable method known in the art, such as spin-on, CVD, and PECVD. Second isolation layer 804 may similarly include a plurality of dielectric layers embedded with metallic interconnects.

In FIG. 8E, word line interconnects $803_W$ connecting gate electrodes 108 and metallic interconnects 803 are formed in isolation layer 514 and second isolation layer 804, providing vertical electrical connections between nonvolatile memory array 700 and transistors 805 in device wafer 510. This 3D cross-bar architecture creates a structure with higher storage density and smaller device footprint than 2.5 gigabits per square millimeter. Word line interconnects $803_W$ may be metallic interconnects, such as conductive vias or conductive wires, and may also be a multilayer interconnection (MLI) including vertical and horizontal interconnects, such as conventional vias or contacts, and horizontal interconnects, such as metal lines. The MLI structure may include conductive lines, conductive vias, and/or interposing dielectric layers (e.g., interlayer dielectric (ILD)). The MLI structure also provides electrical connection to and between the transistors. The conductive lines in various levels may comprise copper, aluminum, tungsten, tantalum, titanium, nickel, cobalt, metal silicide, metal nitride, polysilicon, combinations thereof, and/or other materials possibly including one or more layers or linings. The linings include adhesion layer, barrier layer, etch stop layer, and anti-reflective coatings. The interposing or inter-layer dielectric layers (e.g., ILD layer(s)) may comprise silicon dioxide, fluorinated silicon glass (FSG), or at least one low-k dielectric material. The MLI may be formed by suitable processes typical in CMOS fabrication such as, but not limited to, CVD, PVD, ALD, plating, spin-on coating, and/or other processes. In one example, a damascene process is used to form a copper multilayer interconnection structure. In an exemplary damascene process, an opening is formed in a dielectric layer, which separates the vertically spaced metallization layers. The opening is typically formed using conventional lithographic and etching techniques. After formation, the opening is filled with titanium nitride, tungsten or other metals, metal alloys, or stacks of metals and/or metal alloys to form a via. Excess metal material on the surface of the dielectric layer is then removed by chemical mechanical polishing (CMP). Copper or conductive material forms interconnect lines connected to the vias.

FIG. 8F is a cross-sectional view of the exemplary nonvolatile memory array 700 and device wafer 510 taken along cut 704 of FIG. 7 after the formation of bit line interconnects $803_B$. Bit line interconnects $803_B$ also provide vertical electrical connections between nonvolatile memory array 700 and transistors 805 in device wafer 510. Bit-line interconnects $803_B$ may also be metallic interconnects, such as but not limited to tungsten vias or conductive wires. Various layers of bit line interconnects $803_B$ can be used to connect the various features described above. Bit line interconnects $803_B$ may also be a multilayer interconnection including vertical and horizontal interconnects, such as conventional vias or contacts, and horizontal interconnects, such as metal lines. In one example, a damascene process is used to form copper-based multilayer interconnection structures.

Figure 9:
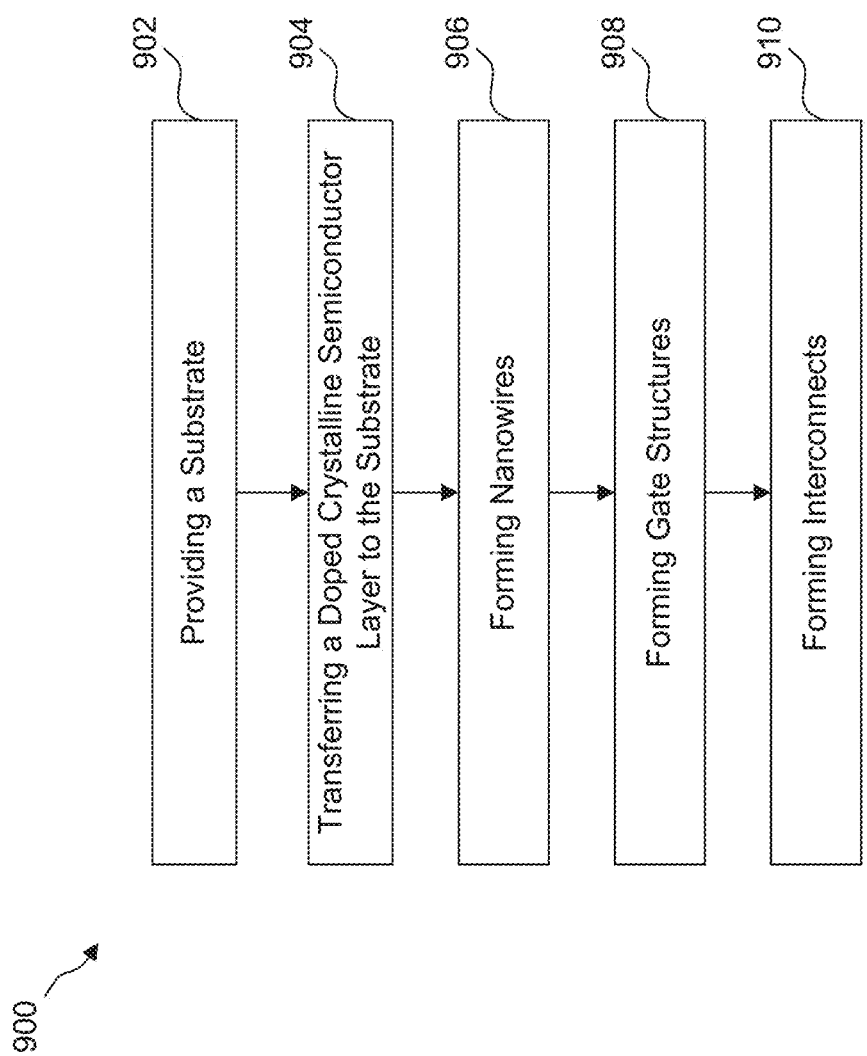
FIG. 9 is a flow diagram illustrating a method, according to some embodiments.

FIG. 9 is a flow diagram of an illustrative method 900 of forming 3D cross-bar nonvolatile memory array using crystalline JLFETs. Other operations may be performed between the various operations of method 900.

Method 900 begins with operation 902, providing a substrate having one or more devices or features formed therein or thereon. The substrate may comprise multiple layers, for example, an ILD layer, a dielectric layer, or an implanted layer, and may have devices or electrical interconnects embedded therein. In some embodiments the substrate is a bulk Si wafer having one or more devices or features formed therein or thereon.

Method 900 continues with operation 904, transferring a semiconductor layer to the substrate, where the semiconductor layer is a doped crystalline semiconductor layer. The crystalline semiconductor layer may be a portion of a seed wafer or attached to a seed layer. The crystalline semiconductor layer is doped, prior to the transferring process, with a desired dopant type and a concentration appropriate for n-type or p-type JLFETs. The transferring process may start with bonding the semiconductor layer to the substrate. A direct bonding process, a metal-to-dielectric bonding process, and any combinations thereof and/or the like may be used. If the semiconductor layer is attached to a seed layer or is a portion of a seed wafer, the transferring process may continue with removing the seed layer or the remainder of the seed wafer. The removal process may be implemented by using suitable techniques such as grinding, chemical-mechanical polishing (CMP), a Smart Cut™ procedure, an ELTRAN® procedure, and/or chemical etching. As a result of the thinning process, the seed layer or the remainder of seed wafer is removed and crystalline semiconductor layer is transferred to the substrate and exposed for subsequent processing.

Method 900 continues with operation 906, forming nanowires from the doped crystalline semiconductor layer. The nanowires are subsequently used as the source/drain terminals and channel regions JLFETs. Nanowires can be fabricated from the crystalline semiconductor layer using suitable processes including photolithography and etch processes. Nanowires may be patterned into any suitable shapes.

Method 900 continues with operation 908, forming a gate dielectric layer and gate electrodes around portions of the nanowires. The gate dielectric may include a high-k dielectric material, an oxide-nitride-oxide (ONO) stack of material, or other suitable material, and may be formed by ALD, PECVD, and/or other suitable deposition processes. Gate electrodes are formed over a portion of the gate dielectric. Gate electrodes and gate dielectrics together comprise gate regions that are configured to control conductivity of the channel regions. Gate electrodes may include any suitable electrically conductive material and can be formed using a litho-etch gate first process or a damascene process. Crystalline nanowires and gate electrodes are used as bit lines and word lines, respectively, to form nonvolatile charge-trapping memory arrays having a cross-bar architecture. As a result, memory cells of the nonvolatile memory array are located at the intersections of word lines and bit lines, allowing the cells to be addressed individually.

Method 900 continues with operation 910, forming interconnects that provide electrical connection for the nonvolatile memory arrays. Interconnects comprise bit-line interconnects and word-line interconnects, and are formed in ILD layers or substrates to provide electrical connections between the nonvolatile memory array and other circuits and power supplies. This 3D cross-bar architecture creates a structure with higher storage density and a smaller footprint than 2.5 gigabit per square millimeter. Bit-line and word-line interconnects may be metallic interconnects, such as vias or conductive wires.

One benefit of embodiments in accordance with this disclosure is that JLFETs is created without a need for thermal processing. All the operations described above, including bonding seed wafer 500, removing first substrate 502, etching, forming source/drain and channel regions, and forming gate dielectric 106 and gate electrode 108, are performed at low temperatures, which do not cause damage to device wafer 510 or the formed wafer assembly 520. In an embodiment, all processing steps are performed at temperatures less than 600° C. Such low temperature processing enables the stacking of several layers of such devices, with the addition of each layer comprising low temperature processing that does not cause damage to previously formed device layers.

Another benefit of embodiments in accordance with this disclosure is that other processes that require heating and may be necessary to form doped crystalline semiconductor layer 504' such as crystallization, ion implantation, or annealing, can be performed prior to the bonding and transferring processes. This prevents devices formed in underlying layers (e.g., the one or more devices or features formed in device wafer 510) from being damaged by the processing temperatures used in fabricating JLFETs with crystalline source, drain, and channel regions.

In one embodiment, a method of forming an array of nonvolatile memory cells provides a substrate having an upper dielectric layer and a plurality of transistors formed below the upper dielectric layer. A multi-layer interconnect is formed above the transistors. The substrate may be a bulk wafer. A doped crystalline semiconductor layer is disposed over the upper dielectric layer and etched to form a plurality of nanowires that are horizontally-oriented with respect to the substrate surface. A charge-trapping stack of layers are formed on the plurality of nanowires. A plurality of gate electrodes are formed on the charge-trapping stack of layers. A first interconnection is formed between a first nanowire of the plurality of nanowires and a first transistor of the plurality of transistors. A second interconnection is formed between a first gate structure of the plurality of gate structures and a second transistor of the plurality of transistors.

In another embodiment, a method of forming a JLFET-based nonvolatile memory provides a substrate having a first dielectric layer and a plurality of transistors formed below the first dielectric layer. A multi-layer interconnect is formed above the transistors. A doped crystalline semiconductor layer is disposed on the first dielectric layer and etched to form a plurality of doped crystalline semiconductor structures on the first dielectric layer. A plurality of gate structures are formed on each one of the plurality of doped crystalline semiconductor structures. A first electrically conductive interconnection is formed between a first doped crystalline semiconductor structure of the plurality of doped crystalline semiconductor structures and a first transistor of the plurality of transistors. A second electrically conductive interconnection is formed between a first gate structure of the plurality of gate structures and a second transistor of the plurality of transistors. Each gate structure of the plurality of gate structures includes a gate electrode.

In a further embodiment, a JLFET-based nonvolatile memory structure includes a substrate having a first dielectric layer, a plurality of transistors disposed below the first dielectric layer, and a plurality of doped crystalline semiconductor structures on the first dielectric layer. The JLFET-based nonvolatile memory structure further includes a multi-layer interconnect above the transistors and a plurality of gate structures on each one of the plurality of doped crystalline semiconductor structures. The structure further includes a first interconnect electrically coupled between a first one of the plurality of doped crystalline semiconductor structures and a first transistor of the plurality of transistors, and a second interconnect electrically coupled between a first gate structure of the plurality of gate structures and a second transistor of the plurality of transistors.

It is to be appreciated that the Detailed Description section, and not the Summary or Abstract of the Disclosure sections, is intended to be used to interpret the claims. The Summary and Abstract of the Disclosure sections may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of forming a nonvolatile memory structure, the method comprising:
   forming a plurality of heavily-doped nanowire structures on a substrate with a plurality of transistors;
   forming a charge-trapping stack of layers on the plurality of heavily-doped nanowire structures;
   forming a plurality of gate electrodes on the charge-trapping stack of layers;
   forming a first interconnect between a first heavily-doped nanowire structure of the plurality of heavily-doped nanowire structures and a first transistor; and
   forming a second interconnect between a first gate electrode of the plurality of gate electrodes and a second transistor.

2. The method of claim 1, wherein forming the plurality of heavily-doped nanowire structures comprises:
   growing a semiconductor layer;
   disposing the semiconductor layer on the substrate; and
   patterning the semiconductor layer.

3. The method of claim 2, further comprising implanting at least one dopant species into the semiconductor layer to form a heavily-doped semiconductor layer prior to disposing the semiconductor layer on the substrate.

4. The method of claim 3, wherein the heavily-doped semiconductor layer has an n-doped concentration between $5 \times 10^{18}$ atoms/cm$^3$ and $5 \times 10^{19}$ atoms/cm$^3$.

5. The method of claim 3, wherein the heavily-doped semiconductor layer has a p-doped concentration between $5 \times 10^{18}$ atoms/cm$^3$ and $5 \times 10^{19}$ atoms/cm$^3$.

6. The method of claim 2, wherein growing the semiconductor layer comprises epitaxially growing silicon.

7. The method of claim 2, wherein growing the semiconductor layer comprises epitaxially growing silicon germanium.

8. The method of claim 1, wherein forming the first and second interconnects comprises etching respective first and second openings in the substrate.

9. The method of claim 1, wherein forming the charge-trapping stack of layers comprises:
   depositing a first oxide layer on each heavily-doped nanowire structure;
   depositing a nitride layer on the first oxide layer; and
   depositing a second oxide layer on the nitride layer.

10. The method of claim 1, wherein the plurality of gate electrodes are arranged in a plurality of rows perpendicularly-oriented to the plurality of heavily-doped nanowire structures.

11. A method of forming a nonvolatile memory, the method comprising:
    forming a plurality of doped crystalline semiconductor structures;
    forming a plurality of gate structures around each of the plurality of doped crystalline semiconductor structures;
    forming a first interconnect to electrically couple a first doped crystalline semiconductor structure of the plurality of doped crystalline semiconductor structures to a first transistor; and
    forming a second interconnect to electrically couple a first gate structure of the plurality of gate structures to a second transistor.

12. The method of claim 11, wherein the doped crystalline semiconductor layer has an n-doped concentration between $5 \times 10^{18}$ atoms/cm$^3$ and $5 \times 10^{19}$ atoms/cm$^3$.

13. The method of claim 11, wherein the doped crystalline semiconductor layer has a p-doped concentration between $5 \times 10^{18}$ atoms/cm$^3$ and $5 \times 10^{19}$ atoms/cm$^3$.

14. The method of claim 11, wherein forming the plurality of gate structures comprises depositing an oxide-nitride-oxide charge-trapping stack over the plurality of doped crystalline semiconductor structures.

15. The method of claim 14, wherein forming the plurality of gate structures further comprises:
    depositing a gate electrode layer over the oxide-nitride-oxide charge-trapping stack; and
    patterning the gate electrode layer.

16. A nonvolatile memory structure comprising:
    a plurality of doped crystalline semiconductor structures;
    a plurality of gate structures around each of the plurality of doped crystalline semiconductor structures;
    a first interconnect electrically coupling a first doped crystalline semiconductor structure of the plurality of doped crystalline semiconductor structures and a first transistor; and
    a second interconnect electrically coupling a first gate structure of the plurality of gate structures and a second transistor.

17. The nonvolatile memory structure of claim 16, wherein a first gate structure of the plurality of gate structures comprises a charge-trapping gate dielectric stack and an electrically conductive gate electrode on the charge-trapping gate dielectric stack.

18. The nonvolatile memory structure of claim 17, wherein the plurality of doped crystalline semiconductor structures are arranged in a plurality of columns and the plurality of gate structures are arranged in a plurality of rows.

19. The nonvolatile memory structure of claim 16, further comprising a second gate structure of the plurality of gate structures and a second doped crystalline semiconductor structure of the plurality of doped crystalline semiconductor structures, wherein the second gate structure is on the first and second doped crystalline semiconductor structures.

20. The nonvolatile memory structure of claim 16, wherein the first doped crystalline semiconductor structure has an n-doped concentration between $5 \times 10^{18}$ atoms/cm$^3$ and $5 \times 10^{19}$ atoms/cm$^3$.

* * * * *